(12) United States Patent
Nakazawa

(10) Patent No.: US 9,278,373 B2
(45) Date of Patent: Mar. 8, 2016

(54) SPIN COATING APPARATUS AND METHOD

(71) Applicant: KABUSHIKI KAISHA TOSHIBA, Minato-Ku, Tokyo (JP)

(72) Inventor: Keisuke Nakazawa, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/017,944

(22) Filed: Sep. 4, 2013

(65) Prior Publication Data

US 2014/0072709 A1 Mar. 13, 2014

(30) Foreign Application Priority Data

Sep. 7, 2012 (JP) .................................. 2012-197503

(51) Int. Cl.
*B05D 3/12* (2006.01)
*B05D 1/00* (2006.01)
*B05C 11/08* (2006.01)
*H01L 21/67* (2006.01)
*G03F 7/16* (2006.01)

(52) U.S. Cl.
CPC ............... *B05D 1/005* (2013.01); *B05C 11/08* (2013.01); *H01L 21/6715* (2013.01); *G03F 7/162* (2013.01)

(58) Field of Classification Search
None
See application file for complete search history.

(56) References Cited

U.S. PATENT DOCUMENTS

| 5,912,049 | A | 6/1999 | Shirley |
| 6,117,486 | A | 9/2000 | Yoshihara |
| 6,299,938 | B1 | 10/2001 | Tateyama |
| 6,440,218 | B1 | 8/2002 | Sanada et al. |
| 6,751,289 | B2 | 6/2004 | Aoki et al. |
| 6,869,640 | B2 | 3/2005 | Yoshihara et al. |
| 6,960,540 | B2 * | 11/2005 | Ito et al. ........................ 438/782 |
| 7,071,107 | B2 | 7/2006 | Hieda et al. |
| 7,413,987 | B2 | 8/2008 | Hieda et al. |
| 7,439,111 | B2 | 10/2008 | Ohtani et al. |

(Continued)

FOREIGN PATENT DOCUMENTS

| JP | 5-123632 | 5/1993 |
| JP | 5-243140 | 9/1993 |

(Continued)

OTHER PUBLICATIONS

Notification of Reason for Rejection issued by the Japanese Patent Office on Jan. 6, 2015, for Japanese Patent Application No. 2012-197503, and English-language translation thereof.

(Continued)

*Primary Examiner* — Kirsten Jolley
(74) *Attorney, Agent, or Firm* — Finnegan, Henderson, Farabow, Garrett & Dunner, L.L.P.

(57) ABSTRACT

In one embodiment, a spin coating apparatus includes a coating liquid feeding module to drop a coating liquid onto a substrate, and a motor to rotate the substrate. The module drops a first drop amount of the coating liquid onto the substrate at a first discharge rate, while the motor rotates the substrate at a first number of rotations. The module drops a second drop amount of the coating liquid onto the substrate at a second discharge rate larger than the first discharge rate, while the motor rotates the substrate at a second number of rotations smaller than the first number of rotations, after the first drop amount of the coating liquid is dropped. The module discharges the coating liquid onto the substrate at a third discharge rate smaller than the second discharge rate, after the coating liquid is discharged onto the substrate at the second discharge rate.

8 Claims, 13 Drawing Sheets

(56) References Cited

U.S. PATENT DOCUMENTS

| | | |
|---|---|---|
| 7,553,662 B2 | 6/2009 | El Haj et al. |
| 7,781,341 B2 | 8/2010 | Nakazawa |
| 7,820,243 B2 | 10/2010 | Yoshihara et al. |
| 7,906,173 B2 | 3/2011 | Yoshihara et al. |
| 8,043,657 B2 | 10/2011 | Yoshihara et al. |
| 8,225,738 B2 | 7/2012 | Yoshihara et al. |
| 8,318,247 B2 | 11/2012 | Yoshihara et al. |
| 8,414,972 B2 | 4/2013 | Yoshihara et al. |
| 8,652,571 B2 | 2/2014 | Nakazawa |
| 2002/0064254 A1 | 5/2002 | Aoki et al. |
| 2002/0150679 A1* | 10/2002 | Minami et al. .............. 427/240 |
| 2003/0008066 A1 | 1/2003 | Yoshihara et al. |
| 2004/0072429 A1 | 4/2004 | Hieda et al. |
| 2004/0147015 A1 | 7/2004 | El-Haj et al. |
| 2005/0126474 A1 | 6/2005 | Yoshihara et al. |
| 2006/0079039 A1 | 4/2006 | Ohtani et al. |
| 2006/0205233 A1 | 9/2006 | Hieda et al. |
| 2007/0092642 A1 | 4/2007 | Yoshihara et al. |
| 2007/0092643 A1 | 4/2007 | Yoshihara et al. |
| 2007/0212894 A1 | 9/2007 | Nakazawa |
| 2007/0254099 A1 | 11/2007 | Yoshihara et al. |
| 2008/0069948 A1 | 3/2008 | Yoshihara et al. |
| 2008/0102211 A1 | 5/2008 | Matsuo et al. |
| 2009/0087559 A1 | 4/2009 | Yoshihara et al. |
| 2009/0226615 A1 | 9/2009 | Nakazawa |
| 2010/0112209 A1 | 5/2010 | Yoshihara et al. |
| 2011/0005459 A1 | 1/2011 | Yoshihara et al. |
| 2011/0052807 A1 | 3/2011 | Ichino et al. |
| 2011/0146572 A1 | 6/2011 | Yoshihara et al. |
| 2011/0250765 A1 | 10/2011 | Yoshihara et al. |
| 2011/0312190 A1 | 12/2011 | Ichino et al. |
| 2012/0021611 A1 | 1/2012 | Yoshihara et al. |
| 2012/0034792 A1 | 2/2012 | Yoshihara et al. |

FOREIGN PATENT DOCUMENTS

| | | |
|---|---|---|
| JP | 8-330206 | 12/1996 |
| JP | 2638969 | 4/1997 |
| JP | 2000-77310 | 3/2000 |
| JP | 2000-153212 | 6/2000 |
| JP | 2000-279874 | 10/2000 |
| JP | 2001-307984 | 11/2001 |
| JP | 3335928 | 8/2002 |
| JP | 2002-307007 | 10/2002 |
| JP | 2004-39828 | 2/2004 |
| JP | 2004-64071 | 2/2004 |
| JP | 3527459 | 2/2004 |
| JP | 2006-126565 | 6/2006 |
| JP | 2007-114715 | 5/2007 |
| JP | 2008-203638 | 9/2008 |
| JP | 2009-10147 | 1/2009 |
| JP | 2010-16046 | 1/2010 |
| JP | 2010-237624 | 10/2010 |
| JP | 4621613 | 11/2010 |
| JP | 4718584 | 4/2011 |
| JP | 4745358 | 5/2011 |

OTHER PUBLICATIONS

Decision of Rejection, issued by Japanese Patent Office, on Sep. 4, 2015, in Japanese Patent Application No. 2012-197503.

* cited by examiner

| STEP | TIME (sec) | NUMBER OF ROTATIONS (rpm) | DISCHARGED LIQUID | DISCHARGE AMOUNT (ml) | DISCHARGE RATE (ml/s) |
|---|---|---|---|---|---|
| S1 | $T_{p1}$ | 0 | PRE-WET LIQUID | $M_p$ | — |
| S2 | $T_{p2}$ | $N_p$ | — | — | — |
| S3 | $T_1$ | $N_1$ | PHOTORESIST | $M_1$ | $V_1$ |
| S4 | $T_2$ | $N_2$ | PHOTORESIST | $M_2$ | $V_2$ |
| S5 | $T_4$ | $N_4$ | — | — | — |

FIG.22

| STEP | TIME (sec) | NUMBER OF ROTATIONS (rpm) | DISCHARGED LIQUID | DISCHARGE AMOUNT (ml) | DISCHARGE RATE (ml/s) |
|---|---|---|---|---|---|
| S1 | $T_{p1}$ | 0 | PRE-WET LIQUID | $M_p$ | — |
| S2 | $T_{p2}$ | $N_p$ | — | — | — |
| S3 | $T_1$ | $N_1$ | PHOTORESIST | $M_1$ | $V_1$ |
| S4 | $T_2$ | $N_2$ | PHOTORESIST | $M_2$ | $V_2$ |
| S5 | $T_3$ | $N_3$ | — | — | — |
| S6 | $T_4$ | $N_4$ | — | — | — |

FIG.23

| COATING AMOUNT (ml) | UNEVEN COATING | THICKNESS UNIFORMITY |
|---|---|---|
| 0.4 | OK | OK |
| 0.35 | OK | OK |
| 0.33 | OK | OK |
| 0.32 | OK | OK |
| 0.30 | NG | OK |

SPIN COATING APPARATUS AND METHOD

CROSS REFERENCE TO RELATED APPLICATION

This application is based upon and claims the benefit of priority from the prior Japanese Patent Application No. 2012-497503, filed on Sep. 7, 2012, the entire contents of which are incorporated herein by reference.

FIELD

Embodiments described herein relate to a spin coating apparatus and method.

BACKGROUND

A spin coating method forms a coating film by dropping a coating liquid onto a substrate and then rotating the substrate at the number of rotations for determining a thickness of the coating liquid. For example, a conventional spin coating method drops the coating liquid onto the substrate while the substrate is rotated, so that the coating liquid is spread on a surface of the substrate and the coating film is thereby formed. However, this method requires a large amount of the coating liquid for forming the coating film. Therefore, as an area of the substrate becomes larger, it is difficult in this method to coat all the way up to an end portion of the substrate or the vicinity of the end portion of the substrate with the coating liquid. Accordingly, the conventional method adjusts various conditions such as the number of rotations of the substrate and a discharge rate of the coating liquid as needed. Meanwhile, in a case where wettability between the substrate and the coating liquid is insufficient, the substrate repels the coating liquid, which may lead to uneven coating of the coating liquid and may deteriorate uniformity in thickness of the coating liquid. When the substrate has a level difference, the uneven coating may possibly be triggered. To reduce the amount of the coating liquid to be used, a method has been proposed which improves the wettability by soaking the substrate with a pre-wet liquid before coating the substrate with the coating liquid. Although this method can reduce problems of a large amount of the coating liquid to be used and problems of poor uniformity in thickness of the coating liquid, these problems still remain without being fully solved. In a case where the pre-wet liquid is used, since it is required to gain a benefit that matches a cost increase caused by the use of the pre-wet liquid, a need for a large amount of the coating liquid is not desirable.

BRIEF DESCRIPTION OF THE DRAWINGS

FIGS. 22 and 23 are tables for explaining specific examples of the spin coating method of the second embodiment; and FIG. 24 is a table showing results of experiments by the spin coating method of the second embodiment.

DETAILED DESCRIPTION

Embodiments will now be explained with reference to the accompanying drawings.

In one embodiment, a spin coating apparatus includes a coating liquid feeding module configured to drop a coating liquid onto a substrate, a motor configured to rotate the substrate, and a controller configured to control operations of the coating liquid feeding module and the motor. The coating liquid feeding module drops a first drop amount of the coating liquid onto the substrate at a first discharge rate, while the motor rotates the substrate at a first number of rotations. The coating liquid feeding module drops a second drop amount of the coating liquid onto the substrate at a second discharge rate which is larger than the first discharge rate, while the motor rotates the substrate at a second number of rotations which is smaller than the first number of rotations, after the first drop amount of the coating liquid is dropped. The coating liquid feeding module discharges the coating liquid onto the substrate at a third discharge rate which is smaller than the second discharge rate, after the coating liquid is discharged onto the substrate at the second discharge rate.

First Embodiment

1) Spin Coating Method of First Embodiment

FIGS. 1A to 2B are cross sectional views showing a flow of a spin coating method of a first embodiment.

Figure 1A:
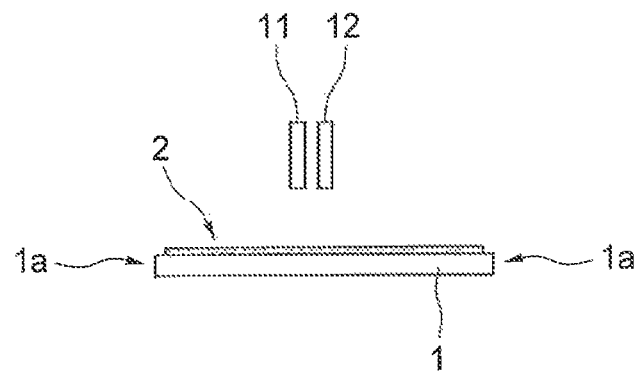
FIGS. 1A to 2B are cross sectional views showing a flow of a spin coating method of a first embodiment.

First, as shown in FIG. 1A, a pre-wet liquid 2 is dropped to a central portion of a substrate 1 and the substrate 1 is rotated, so that the pre-wet liquid 2 is spread on a surface of the substrate 1. The pre-wet liquid 2 is dropped from a nozzle of a pre-wet liquid feeding module 11 to the central portion of the substrate 1.

The substrate 1 is, for example, a circular substrate like a semiconductor wafer. However, the substrate 1 may be a square-shaped substrate like a photomask substrate or a liquid crystal display substrate, or may be another polygonal-shaped substrate. In the present embodiment, level differences are formed on the surface of the substrate 1 due to patterns made of trenches, transistors, memory cells, interconnects or the like.

The pre-wet liquid 2 is preferably a liquid which has compatibility with a coating liquid 3, has a viscosity lower than that of the coating liquid 3, and has a vapor pressure of 10 hPa or less at 23° C. The reason why the pre-wet liquid 2 is desirable to have a lower vapor pressure is that if the pre-wet liquid 2 has a high vapor pressure, a large amount of the pre-wet liquid 2 evaporates during coating treatment of the coating liquid 3.

Figure 1B:
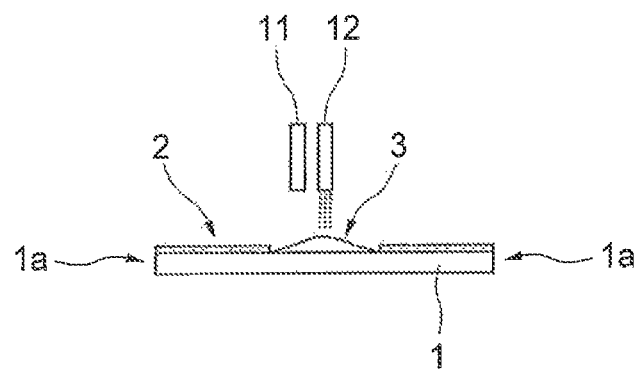

Next, as shown in FIG. 1B, a first drop amount "$M_1$" of the coating liquid 3 is dropped to the central portion of the substrate 1 which is soaked with the pre-wet liquid 2 while the substrate 1 is rotated at a first number of rotations "$N_1$", so that the coating liquid 3 is spread on the surface of the substrate 1. The coating liquid 3 is dropped from a nozzle of a coating liquid feeding module 12 to the central portion of the substrate 1.

Examples of the coating liquid 3 include a photoresist, an anti-reflective material, a photoresist protecting material, a resist pattern shrink material, a protective material for immersion exposure, a polyimide liquid, an SOG (spin-on glass) liquid, a low-k material, and a sol-gel material. The coating liquid 3 may also be a material for forming under a photoresist, a material for forming on a photoresist, a planarization material, an embedding material or the like.

In the present embodiment, the first number of rotations "$N_1$" is set to the number of rotations at which the coating liquid 3 cannot substantially be spread on the entire substrate 1. More specifically, the first number of rotations "$N_1$" is set to the number of rotations at which the coating liquid 3 receives sufficient air resistance (due to development of a turbulent flow) in a peripheral portion of the substrate 1. For example, when the substrate 1 is a wafer with a diameter of 300 mm, the first number of rotations "$N_1$" is preferably set at 3000 rpm or more. Depending on the material of the coating liquid 3, the first number of rotations "$N_1$" may be set to 2000 rpm or more. In the present embodiment, the first drop amount "$M_1$" is set to an amount which is substantially too small to uniformly coat the entire substrate 1 with the coating liquid 3.

Figure 1C:
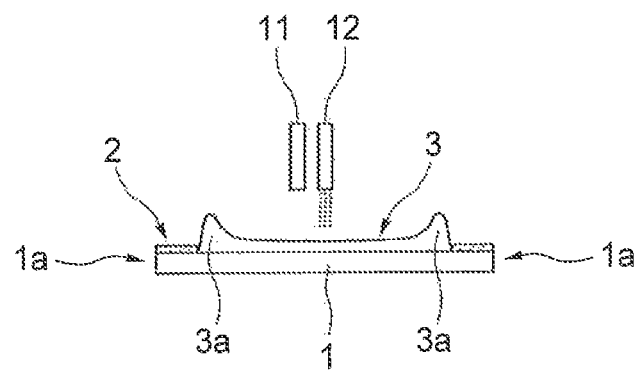

As shown in FIG. 1C, it is possible to produce the state where the peripheral portion of the substrate 1 is not substantially coated with the coating liquid 3 by setting the first number of rotations "$N_1$" to the high speed as mentioned above. This is because forward movement of the coating liquid 3 is stopped when the coating liquid 3 receives sufficient air resistance. When a level difference is present on the surface of substrate 1, it tends to stop the forward movement of the coating liquid 3.

As shown in FIG. 1C, the coating liquid 3 is put in the state where it is spread up to a position inward of an end portion 1a of the substrate 1 due to the stop of the forward movement of the coating liquid 3. A swell of the coating liquid 3 designated by reference character 3a is formed at an end portion of the coating liquid 3. As the first number of rotations "$N_1$" becomes higher, the position at which the forward movement of the coating liquid 3 stops moves toward the central portion of the substrate 1, time taken for reaching a critical point becomes shorter, and a swell amount of the coating liquid 3 increases. The coating liquid 3 in the swell portion is gradually scattered over the peripheral portion and an outside of the substrate 1.

A description is now given of the pre-wet liquid 2 in the stage of FIG. 1C.

Since the coating liquid 3 is a liquid for forming a coating film, its viscosity is generally high. Accordingly, since the coating liquid 3 is generally hard to spread on the substrate 1 and is susceptible to air resistance, the swell is formed at the end portion of the coating liquid 3 at the time of high speed rotation of the substrate 1. In contrast, if a low-viscosity liquid is used as the pre-wet liquid 2, it is possible to prevent the swell from forming at the end portion of the pre-wet liquid 2 at the time of high speed rotation of the substrate 1. FIG. 1C shows the pre-wet liquid 2 forming no swell at the end portion of the pre-wet liquid 2.

It is desirable that the end portion of the pre-wet liquid 2 is always positioned on a more peripheral side of the substrate 1 than the end portion of the coating liquid 3. This is because if the end portion of the coating liquid 3 moves past the end portion of the pre-wet liquid 2, the past area fails to receive benefit of the wettability improvement effect. This may be achieved by increasing the time of rotating the pre-wet liquid 2 and delaying the drop time of the coating liquid 3. If the pre-wet liquid 2 has a high vapor pressure, the pre-wet liquid 2 starts to dry from the peripheral portion of the substrate 1 during rotation of the substrate 1 after the pre-wet liquid 2 reaches the peripheral portion of the substrate 1, and the end portion of the pre-wet liquid 2 recedes toward the central portion of the substrate 1. As a result, the end portion of the pre-wet liquid 2 is sooner or later passed by the end portion of the coating liquid 3.

At the stage when the dropping of the first drop amount "$M_1$" of the coating liquid 3 has been ended, or at the stage when the rotation at the first number of rotations "$N_1$" has been ended, the end portion of the pre-wet liquid 2 desirably reaches the end portion (outermost peripheral portion) 1a of the substrate 1 but the receding of the pre-wet liquid 2 due to drying does not occur. In this case, at the stage when the dropping of a second drop amount "$M_2$" of the coating liquid 3 is started, the end portion of the pre-wet liquid 2 has reached the end portion 1a of the substrate 1 and is held there.

Figure 2A:
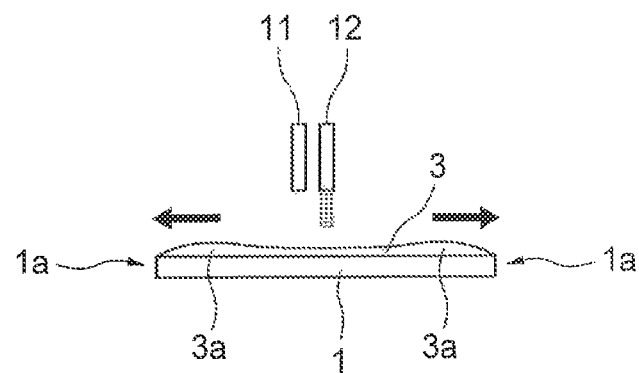

Next, as shown in FIG. 2A, the second drop amount "$M_2$" of the coating liquid 3 is dropped to the central portion of the substrate 1 while the substrate 1 is rotated at a second number of rotations "$N_2$" which is smaller than the first number of rotations so that the coating liquid 3 is further spread on the surface of the substrate 1. It is desirable to continuously perform dropping of the first drop amount "$M_1$" of the coating liquid 3 and dropping of the second drop amount "$M_2$" of the coating liquid 3.

If the number of rotations of the substrate 1 is lowered from the first number of rotations "$N_1$" to the second number of rotations "$N_2$", air resistance that the coating liquid 3 receives becomes weaker, which promotes the coating liquid 3 to more toward the end portion 1a of the substrate 1. When the second drop amount "$M_2$" of the coating liquid 3 is newly dropped in this state, the coating liquid 3 which has already been dropped on the substrate 1 is extruded. As a result, the coating liquid 3 spreads to the end portion 1a of the substrate 1 or to the vicinity of the end portion 1a of the substrate 1.

At the end portion of the coating liquid 3, the coating liquid 3 moves forward as the swell of the coating liquid 3 becomes lower as shown in FIG. 2A. Therefore, most remaining parts of the peripheral portion of the substrate 1 can be coated with the coating liquid 3 of the swell portion. Accordingly, it is not necessary in the present embodiment to increase the second drop amount "$M_2$" of the coating liquid 3, and it suffices that the second drop amount "$M_2$" of the coating liquid 3 is less than the first drop amount "$M_1$" of the coating liquid 3.

It is also desirable that the pre-wet liquid 2 is held up to the end portion 1a of the substrate 1 until immediately before the coating liquid 3 reaches the end portion 1a of the substrate 1. The reason of this is to maintain the wettability improvement effect by the pre-wet liquid 2 up to the end portion is of the substrate 1. Accordingly, it is desirable to adopt a liquid with a low vapor pressure as the pre-wet liquid 2, and it is therefore desirable, for example, to adopt a liquid having a vapor pressure of 10 hPa or less at 23° C. as the pre-wet liquid 2. In this case, the pre-wet liquid 2 is finally extruded from the substrate 1 by the coating liquid 3.

Figure 2B:
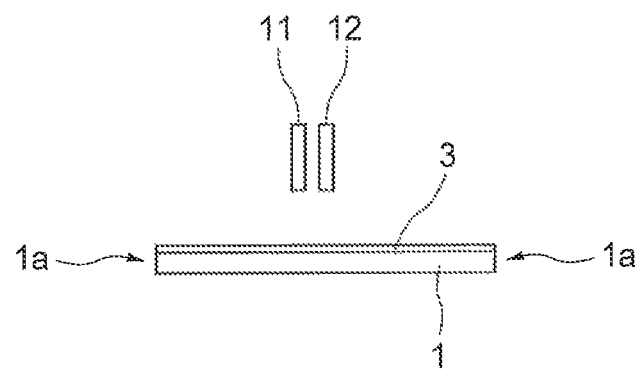

Next, as shown in FIG. 2B, the thickness of the coating liquid 3 is controlled to be a predetermined value by rotating the substrate 1 at a third number of rotations for determining the thickness of the coating liquid 3. Before the substrate 1 is rotated at the third number of rotations, the substrate 1 may be rotated, for example, at the number of rotations as low as about 100 rpm to perform reflow treatment for several seconds. The extrusion of the pre-wet liquid 2 by the coating liquid 3 may be performed not at the stage of FIG. 2A but at the stage of FIG. 2B.

In the present embodiment, the edge of the coating liquid 3 is then cut away and a solvent in the coating liquid 3 is evaporated by baking. In this way, a coating film is formed from the coating liquid 3.

A description is now given of effects of the embodiment.

In the spin coating method, as the size of the substrate 1 increases, the coating liquid 3 becomes more susceptible to air resistance at the time of rotating the substrate 1. Since the air resistance becomes larger in the peripheral portion of the substrate 1 as compared with the central portion of the substrate 1, the coating liquid 3 becomes hard to spread in the peripheral portion of the substrate 1 as the number of rotations of the substrate 1 increases. This problem is unavoidable even when the substrate 1 is soaked with the pre-wet liquid 2 in advance.

Accordingly, in the case of dropping the pre-wet liquid 2 and then dropping the coating liquid 3 in the present embodiment, the coating liquid 3 is first dropped while the substrate 1 is rotated at the high-speed first number of rotations "$N_1$". When the forward movement of the coating liquid 3 stops at the position inward of the end portion 1a of the substrate 1, the number of rotations of the substrate 1 is then changed to the low-speed second number of rotations "$N_2$" to drop the coating liquid 3. Therefore, it is possible to coat all the way to the end portion 1a of the substrate 1 or the vicinity of the end portion 1a of the substrate 1 with the coating liquid 3 to form a coating film, while keeping the drop amount of the coating liquid 3 to a small amount. The drop amount of the coating liquid 3 can be reduced, for example, by setting the second drop amount "$M_2$" of the coating liquid 3 sufficiently lower than the first drop amount "$M_1$" of the coating liquid 3, or by appropriately setting the timing to change the number of rotations of the substrate 1 so as to reduce the amount of the coating liquid 3 which is wasted by scattering.

Moreover, such coating treatment of the coating liquid 3 in the present embodiment is performed after the substrate 1 is soaked with the pre-wet liquid 2. This makes it possible to coat all the way to the end portion 1a of the substrate 1 or the vicinity of the end portion 1a of the substrate 1 with the coating liquid 3 which has sufficient thickness uniformity.

The spin coating method of the present embodiment is suitably used in the case of, for example, coating the substrate 1 with the coating liquid 3 having a viscosity of 0.1 to 1000 mPa·s.

However, the coating liquid 3 may have the viscosity out of this range. The coating liquid 3 may be formed of an organic material or an inorganic material.

2) Spin Coating Apparatus of First Embodiment

Figure 3:
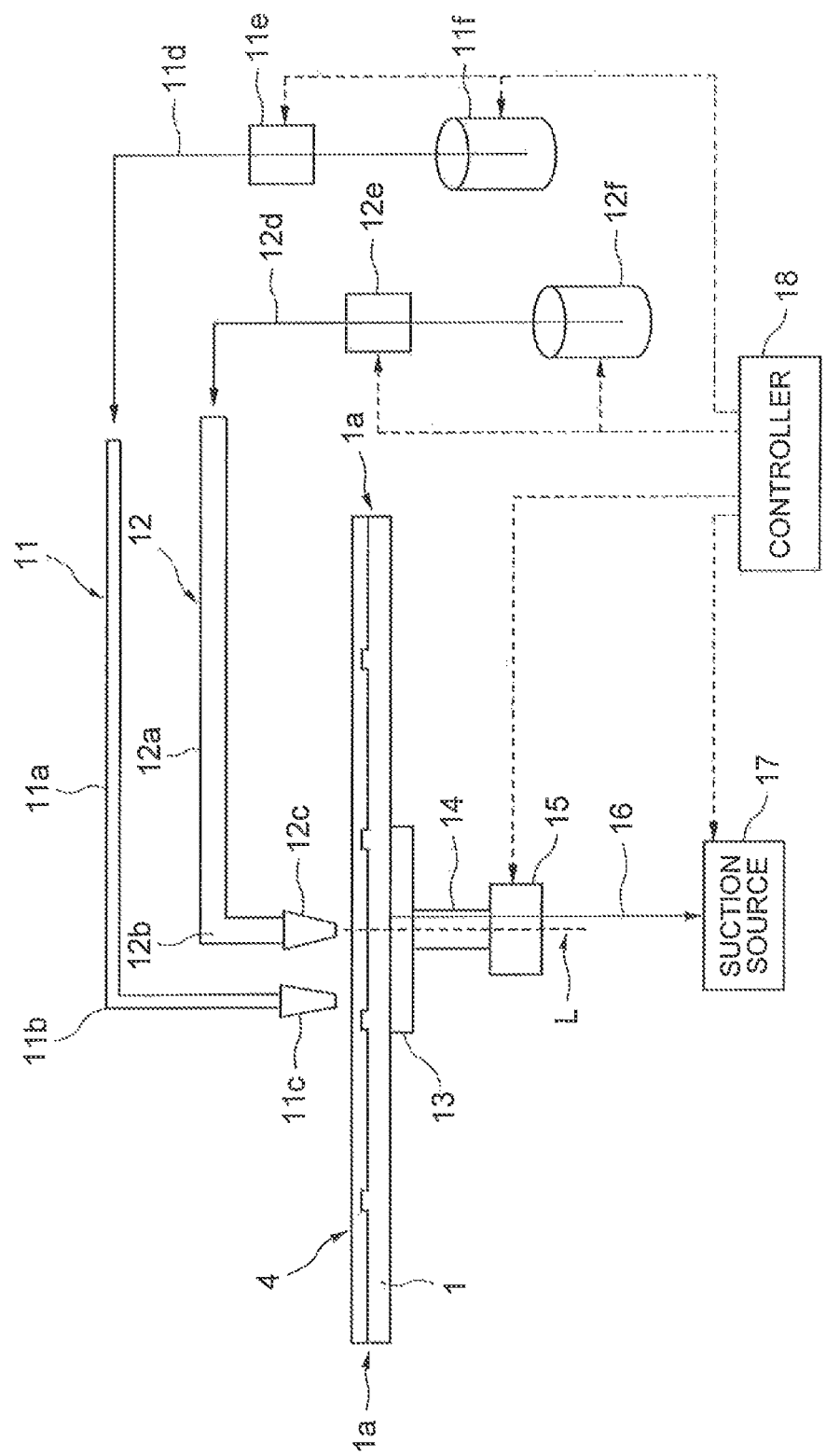
FIG. 3 is a schematic view showing a configuration of a spin coating apparatus of the first embodiment.

FIG. 3 is a schematic view showing a configuration of a spin coating apparatus of the first embodiment. The above spin coating method can be executed, for example, with the spin coating apparatus of FIG. 3.

The spin coating apparatus of FIG. 3 includes a pre-wet liquid feeding module 11, a coating liquid feeding module 12, a holding module 13, a rotating shaft 14, a motor 15, a vacuum line 16, a suction source 17, and a controller 18.

In FIG. 3, a wafer (substrate) 1 is laid on the holding module 13 so as to be held horizontally. The holding module 13 is fixed to the rotating shaft 14, and is connected to the motor 15 via the rotating shaft 14. The motor 15 is a rotational driving source which rotates the wafer 1 by rotationally driving the holding module 13 around a rotation axis L which is parallel to a vertical direction. The motor 15 is configured so that the number of rotations (rotational speed) is variable.

The wafer 1 has a first surface as a front side surface, and a second surface as a back side surface. FIG. 3 shows a coating film 4 formed on the first surface of the wafer 1 which has level differences. The wafer 1 is held on the holding module 13 so that the second surface is in contact with the holding module 13. In this case, the wafer 1 is laid on the holding module 13 so that the center of the wafer 1 is aligned with the rotation axis L.

The holding module 13 is connected to the suction source 17 via the vacuum line 16. The wafer 1 laid on the holding module 13 is held by vacuum-holding the second surface by suction force of the suction source 17.

The coating liquid feeding module 12 feeds the coating liquid 3 to the wafer 1 held on the holding module 13. The coating liquid feeding module 12 includes an arm 12a, and a nozzle 12c which is opened downward at a free end portion 12b of the arm 12a so that the coating liquid 3 is dropped onto the wafer 1 held on the holding module 13. The coating liquid feeding module 12 further includes a coating liquid feed source 12f connected to the arm 12a via a coating liquid feed pipe 12d, and a discharge controller 12e placed between the arm 12a and the coating liquid feed source 12f to adjust a flow rate of the coating liquid 3. The discharge controller 12e is implemented by, for example, a device such as a feed type pump.

The arm 12a of the coating liquid feeding module 12 is connected to an arm moving module (not shown). The arm moving module has a function to move the nozzle 12c from a housing place of the nozzle 12c which is placed distant from the wafer 1, to an upper region of the central portion of the wafer 1 which is a drop position of the coating liquid 3. The arm moving module further has a function to adjust the height of the nozzle 12c at the drop position of the coating liquid 3.

The pre-wet liquid feeding module 11 feeds the pre-wet liquid 2 to the wafer 1 held on the holding module 13. The pre-wet liquid feeding module 11 includes an arm 11a, a free end portion 11b, a nozzle 11c, a pre-wet liquid feed pipe 11d, a discharge controller 11e, a pre-wet liquid feed source 11f, and an arm moving module (not shown) as similarly to the coating liquid feeding module 12.

In the present embodiment, a photoresist is used as the coating liquid 3 to form a resist film as the coating film 4, for example. In this case, it is desirable to use, as the pre-wet liquid 2, a liquid having compatibility with the photoresist, such as a solvent of the photoresist.

The controller 18 is configured by a computer for example, and controls operations of respective modules of the spin coating apparatus. The controller 18 has a function that an operator can program treatment procedures of the wafer 1 to streamline the treatment of the wafer 1 for example.

The controller 18 controls, for example, the rotation speed and rotating time of the motor 15, the drop amount and discharge rate of the coating liquid 3 by the coating liquid feeding module 12, the drop amount and discharge rate of the pre-wet liquid 2 by the pre-wet liquid feeding module 11, the operation of the arm moving modules of the coating liquid feeding module 12 and the pre-wet liquid feeding module 11 and the like. The above rotational driving method may be implemented by the controller 18 controlling the operations of the pre-wet liquid feeding module 11, the coating liquid feeding module 12, and the motor 15.

3) Specific Examples of Spin Coating Method of First Embodiment

Figures 4, 5:
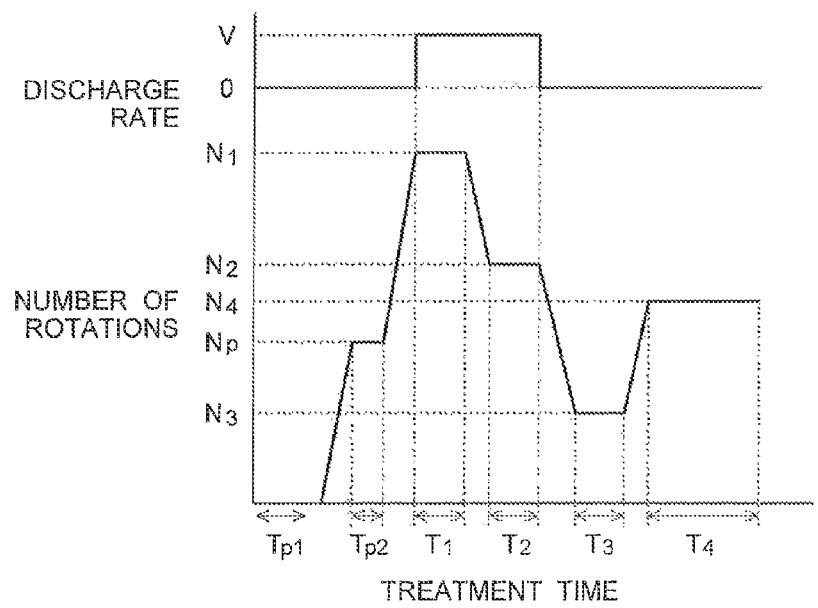
FIGS. 4 and 5 are respectively a table and a graph for explaining a specific example of the spin coating method of the first embodiment.

FIGS. 4 and 5 are respectively a table and a graph for explaining a specific example of the spin coating method of the first embodiment. FIG. 4 shows an example of a recipe of the spin coating method of the first embodiment, while FIG. 5 shows an example of a sequence for operating the spin coating apparatus based on this recipe. Experiments regarding this recipe were conducted by using the coating liquid 3 with a viscosity of 1 mPa·s.

First, the pre-wet liquid feeding module 11 drops a drop amount "$M_p$" of the pre-wet liquid 2 to the central portion of the wafer 1 (Step S1). Reference character $T_{p1}$ designates drop time for dropping the drop amount "$M_p$" of the pre-wet liquid 2. The drop amount "$M_p$" is 3 ml, for example.

Next, the motor 15 rotates the wafer 1 at number of rotations "$N_p$", so that the pre-wet liquid is spread on the surface of the wafer 1 (Step S2). Reference character $T_{p2}$ designates time of rotating the wafer 1 at the number of rotations "$N_p$". For example, the number of rotations "$N_p$" is 1000 to 4000 rpm. For example, the rotating time "$T_{p2}$" is 0.1 to 3 sec (seconds).

When a liquid with a high vapor pressure is used as the pre-wet liquid 2, the pre-wet liquid 2 may evaporate before the coating liquid 3 reaches the end portion 1a of the wafer 1, which may cause uneven coating in the peripheral portion of the wafer 1. Under these circumstances, it is desirable to keep the pre-wet liquid 2 up to the end portion 1a of the wafer 1 until the coating liquid 3 reaches the end portion 1a of the wafer 1. Accordingly, the pre-wet liquid 2 is preferably a liquid which has compatibility with the coating liquid 3, has a viscosity lower than that of the coating liquid 3, and has a vapor pressure of 10 hPa or less at 23° C.

Next, the coating liquid feeding module 12 drops the first drop amount "$M_1$" of the coating liquid 3 to the central portion of the wafer 1 while the motor 15 rotates the wafer 1 at the first number of rotations "$N_1$", so that the coating liquid 3 is spread on the surface of the wafer 1 (Step S3). Reference character $T_1$ designates time of rotating the wafer 1 at the first number of rotations "$N_1$".

Here, the first number of rotations "$N_1$" is set to the number of rotations at which the first drop amount "$M_1$" of the coating liquid 3 does not uniformly spread on the entire wafer 1 due to air resistance. For example, when the wafer 1 has a diameter of 300 mm, the first number of rotations "$N_1$" is set to 2000 to 4000 rpm, and the first drop amount "$M_1$" of the coating liquid 3 is set to 0.3 ml. The state where the first drop amount "$M_1$" of the coating liquid 3 does not uniformly spread on the entire wafer 1 due to air resistance is the state as shown in FIG. 1C for example.

Next, the coating liquid feeding module 12 drops the second drop amount "$M_2$" of the coating liquid 3 to the central portion of the wafer 1 while the motor 15 rotates the wafer 1 at the second number of rotations "$N_2$" which is smaller than the first number of rotations "$N_1$", so that the coating liquid 3 is further spread on the surface of the wafer 1 (Step S4). Reference character $T_2$ designates time of rotating the wafer 1 at the second number of rotations "$N_2$".

Dropping the first drop amount "$M_1$" of the coating liquid 3 and dropping the second drop amount "$M_2$" of the coating liquid 3 may be continuously performed. The second drop amount "$M_2$", which may be smaller than the first drop amount "$M_1$", is set to, for example, 0.1 ml. In this case, a total drop amount "$M_1+M_2$" of the coating liquid 3 is 0.4 ml. The second number of rotations "$N_2$" is set to, for example, 1000 to 3000 rpm.

Reference character "V" designates a discharge rate (discharge amount per unit time) of the coating liquid 3. In the case of dropping the first and second drop amounts "$M_1$" and "$M_2$" of the coating liquid 3, the discharge rate of the coating liquid 3 is defined as "$M_1/T_1$" and "$M_2/T_2$", respectively. Hereinafter, the former is referred to as a first discharge rate and the latter is referred to as a second discharge rate. In this recipe, although the first discharge rate is equal to the second discharge rate, the first discharge rate should desirably be set smaller than the second discharge rate. If so set, it becomes possible to take a long time to drop the first drop amount "$M_1$" of the coating liquid 3, whereby the swell at the end portion of the coating liquid 3 may be enlarged. A specific example where the first discharge rate is set smaller than the second discharge rate will be explained in a second embodiment.

Next, the motor 15 rotates the wafer 1 at number of rotations "$N_3$" to perform reflow treatment (Step S5). Reference character $T_3$ designates time of rotating the wafer 1 at the number of rotations "$N_3$". The reflow treatment improves uniformity in thickness of the coating liquid 3 which is applied on the wafer 1. It is also possible to omit the reflow treatment.

Next, the motor 15 rotates the wafer 1 at number of rotations "$N_4$" for determining the thickness of the coating liquid 3 (Step S6). As a consequence, the thickness of the coating film 3 coating the wafer 1 is controlled to be a desired value. Reference character $T_4$ designates time of rotating the wafer 1 at the number of rotations "$N_4$". The number of rotations "$N_4$" corresponds to the above-described third number of rotations.

In this recipe, the edge of the coating liquid 3 is then cut by using thinner. Furthermore, the wafer 1 is automatically transferred to a hot plate, where the wafer 1 is baked to evaporate a solvent of the coating liquid 3. The baked wafer 1 is then cooled. In this way, the coating film 4 is formed from the coating liquid 3.

Examples of the coating liquid 3 include, in addition to the examples shown before, silazanes such as polysilazane, and siloxanes such as polysiloxane. Specific examples of the former include perhydropolysilazane (PHPS) made up of only Si, N and H elements, while specific examples of the latter include hydrogen silsesquioxane (HSQ) made up of only Si, O and H elements.

Typical examples of the pre-wet liquid 2 include cyclohexanone for resists, and di-n-butyl ether for silazanes and siloxanes. Other examples of the pre-wet liquid 2 include terpenes. Generally, terpenes have a vapor pressure of 6 hPa or less at 23° C., which is lower than the vapor pressure of di-n-butyl ether. Therefore, terpenes are suitable for use as the pre-wet liquid 2 since they do not easily evaporate during coating treatment of the coating liquid 3. Examples of terpenes include α-pinene, β-pinene, p-menthane, d-limonene, dipentene, and 1,8-cineole. The pre-wet liquid 2 may be a mixture containing terpenes. The pre-wet liquid 2 may be any liquids other than terpenes, as long as the liquids have a low vapor pressure like terpenes.

Next, a description is given of process time of the pre-wet liquid 2 and the coating liquid 3. For example, 3 ml of din-butyl ether or α-pinene is dropped to the center of the substrate 1 as the pre-wet liquid 2, and the substrate 1 is rotated at the number of rotations "$N_p$", which is set to 1000 rpm, for rotating time "$T_p$". Then, as soon as the number of rotations "$N_1$" is increased to 2500 rpm, the coating liquid 3 having a viscosity of 1 mPa·s is dropped. In this case, if di-n-butyl ether is used and the time "$T_p$" is set to a value more than 0.1 sec, the uneven coating may occur in the peripheral portion of the substrate. On the contrary, if α-pinene is used, the uneven coating does not occur and the thickness uniformity can be improved with a larger time "$T_p$", and a good coating film 4 may be formed by setting the time "$T_p$" to 0.5 sec or more (more preferably 1 sec or more).

If total time of the time "$T_p$" for spreading the pre-wet liquid 2 and the subsequent time up to the end of dropping of the coating liquid 3 is set to be long, the amount of the coating liquid 3 to be used can be reduced. The total time is, for example, about 1.5 sec or more.

As described above, in the case of dropping the pre-wet liquid 2 and then dropping the coating liquid 3 in the present embodiment, the coating liquid 3 is dropped while the substrate 1 is rotated at the first number of rotations "$N_1$", and then the coating liquid 3 is dropped while the substrate 1 is rotated at the second number of rotations "$N_2$" which is smaller than the number of rotations "$N_1$". Therefore, according to the present embodiment, it is possible to form the coating film 4 in a wider area while reducing the drop amount of the coating liquid 3.

Second Embodiment

1) Spin Coating Method of Second Embodiment

FIGS. 6 to 21 are graphs for explaining first to sixteenth examples of a spin coating method of a second embodiment, respectively.

In the second embodiment, when the coating liquid 3 is dropped while the substrate 1 is rotated at the first number of rotations "$N_1$", the coating liquid 3 is discharged to the substrate 1 at a first discharge rate "$V_1$". In the present embodiment, when the coating liquid 3 is dropped while the substrate 1 is rotated at the second number of rotations "$N_2$" which is smaller than the number of rotations "$N_1$", the coating liquid 3 is discharged to the substrate 1 at a second discharge rate "$V_2$" which is larger than the first discharge rate "$V_1$". Hereinafter, a description is given of various examples of the spin coating method of the second embodiment.

Each of the following examples is explained on the assumption that a wafer with a diameter of 300 mm in is used as the substrate 1. However, the present embodiment is applicable to those using other substrates 1, such as the case of using a substrate 1 with a smaller diameter and the case of using a large-size substrate 1 like a liquid crystal display substrate.

Figure 6:
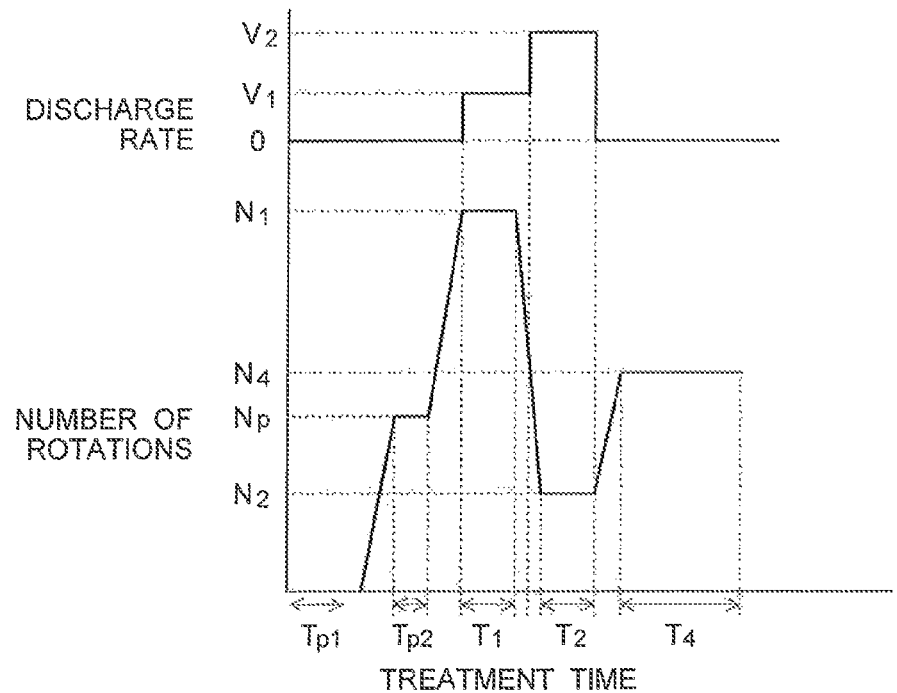
FIGS. 6 to 21 are graphs for explaining first to sixteenth examples of a spin coating method of a second embodiment, respectively.

FIG. 6 is a graph for explaining the first example of the spin coating method of the second embodiment. A horizontal axis of FIG. 6 represents time while a vertical axis of FIG. 6 represents the number of rotations of the substrate 1 and the discharge rate of the coating liquid 3.

In FIG. 6, first, the pre-wet liquid 2 is dropped in time "$T_{p1}$", and then, the substrate 1 is rotated at the number of rotations "$N_p$" in time "$T_{p2}$", so that the pre-wet liquid 2 is spread on the substrate 1. For example, the number of rotations "$N_p$" is comprehensively determined within the range of 1000 to 4000 rpm based on drying characteristics of the pre-wet liquid 2, compatibility with the coating liquid 3, and the like. In FIG. 6, the substrate 1 may be rotated in the time "$T_{p1}$".

Next in FIG. 6, the first drop amount "$M_1$" of the coating liquid 3 is dropped at the first discharge rate "$V_1$" while the substrate 1 is rotated at the first number of rotations "$N_1$". Next, the second drop amount "$M_2$" of the coating liquid 3 is dropped at the second discharge rate "$V_2$", which is larger than the first discharge rate "$V_1$", while the substrate 1 is rotated at the second number of rotations "$N_2$". Although the first discharge is performed at the first discharge rate "$V_1$" immediately followed by the second discharge at the discharge rate "$V_2$" in FIG. 6, it is possible to have a break after the first discharge and then to perform the second discharge (see FIG. 7).

In FIG. 6, it is desirable that the drop amount of the coating liquid 3 be set to "$M_1$">"$M_2$". If so set, it becomes possible to improve surface uniformity in thickness of the coating liquid 3 by discharging a small amount of the coating liquid 3 at a high speed at the end. It is desirable to set the first number of rotations "$N_1$" to 500 to 4000 rpm for example in consideration of the concentration and viscosity of the coating liquid 3. It is also desirable to set the second number of rotations "$N_2$" lower than the first number of rotations "$N_1$".

In FIG. 6, the second number of rotations "$N_2$" may be set as the number of rotations for reflow treatment. In this case, the second number of rotations "$N_2$" is set to, for example, 100 to 500 rpm, and the time "$T_2$" is set to 1 to 5 seconds. The reflow treatment has an effect to improve surface uniformity in thickness of the coating liquid 3. Accordingly, in order to gain this effect, dropping of the coating liquid 3 may be stopped while the substrate 1 is rotated at the second number of rotations "$N_2$" (see FIG. 8). The second number of rotations "$N_2$" may be set to a value higher than 500 rpm (e.g., 1000 rpm or more).

Figure 7:
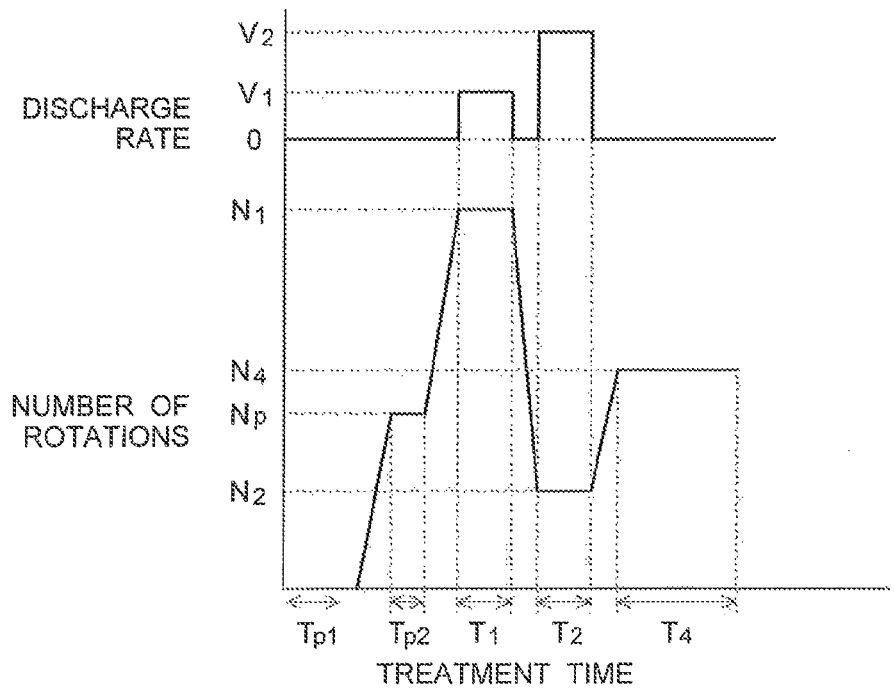
Figure 8:
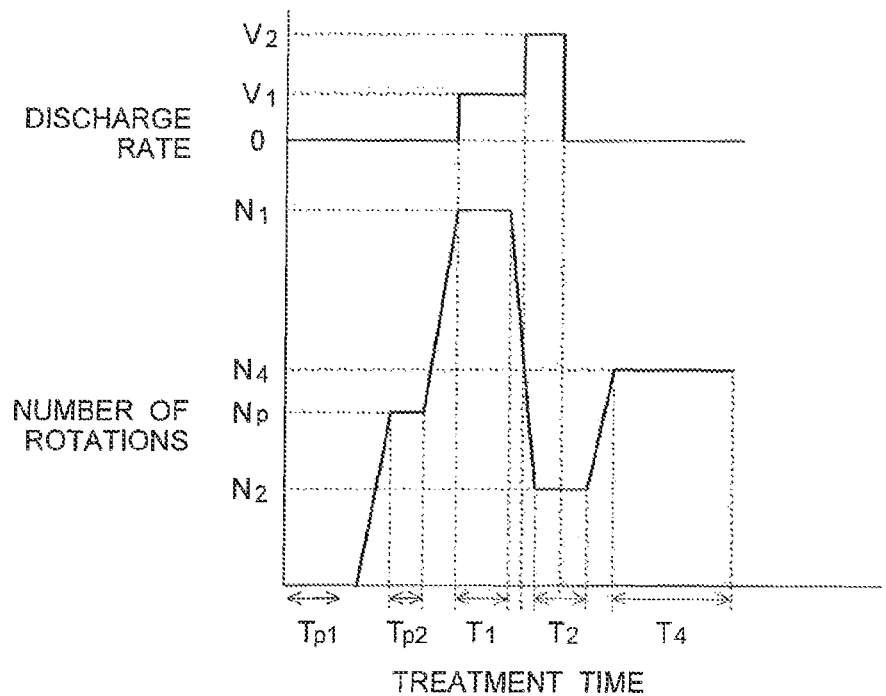

In FIGS. 6 to 8, for example, the first discharge rate "$V_1$" is set to 1 ml/s or less and the second discharge rate "$V_2$" is set to 1.5 ml/s or more, though they may be set to other values. In FIGS. 6 to 8, almost as soon as the number of rotations of the substrate 1 changes from "$N_1$" to "$N_2$", the discharge rate of the coating liquid 3 is changed from "$V_1$" to "$V_2$". However, it is not necessary to coincide the timing to change the number of rotations and the timing to change the discharge rate. For example, the discharge rate may be changed from "$V_1$" to "$V_2$" while the substrate 1 is rotated at the first number of rotations "$N_1$". Similarly, the discharge rate may be changed from "$V_1$" to "$V_2$" while the substrate 1 is rotated at the second number of rotations "$N_2$".

In FIG. 6, the substrate 1 is then rotated at the number of rotations "$N_4$" for time "$T_4$". The number of rotations "$N_4$" is the number of rotations which is to determine the thickness of the coating film 3. Although the number of rotations "$N_4$" is set larger than the number of rotations "$N_2$" in this example, the number of rotations "$N_4$" may be set smaller than the number of rotations "$N_2$".

Then, in the process of FIG. 6, rinsing solution is used to cut edges and clean the back surface, and further the substrate 1 is continuously rotated at an arbitrary number of rotations to dry the rinsing solution. The number of rotations for the drying process is not limited.

Figure 9:
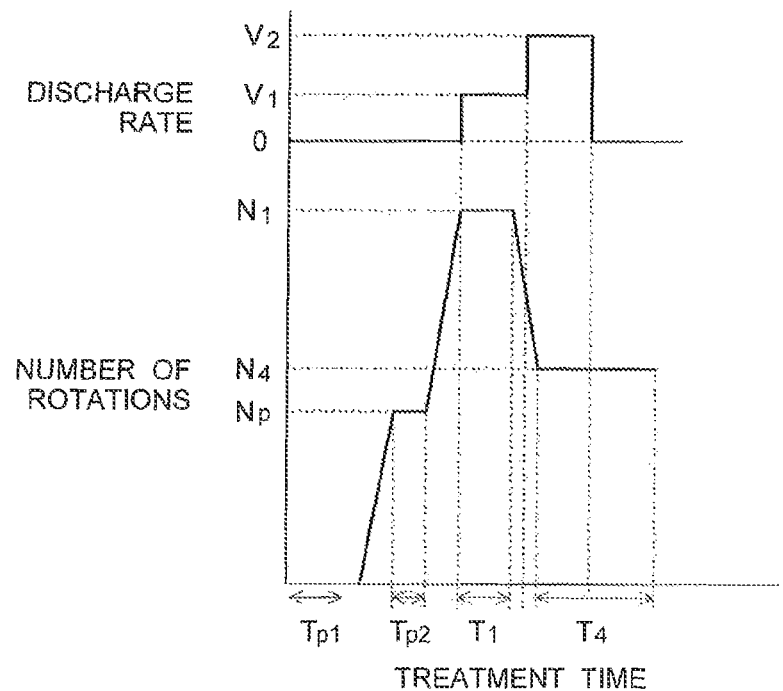

In order to shorten the process time, a step at the second number of rotations "$N_2$" and a step at the number of rotations "$N_4$" for determining the thickness may be carried out as one step (see FIG. 9). In FIG. 9, the coating liquid 3 is dropped at the first discharge rate "$V_1$" while the substrate 1 is rotated at the first number of rotations "$N_1$", and then the coating liquid 3 is successively dropped at the second discharge rate "$N_2$" while the substrate 1 is rotated at the number of rotations "$N_4$" which is to determine the thickness. While the substrate 1 is rotated at the number of rotations "$N_4$" which is to determine the thickness, discharge of the coating liquid 3 is stopped but rotation of the substrate 1 is continued.

A description is now given of the spin coating methods of FIGS. 10 to 13.

Figure 10:
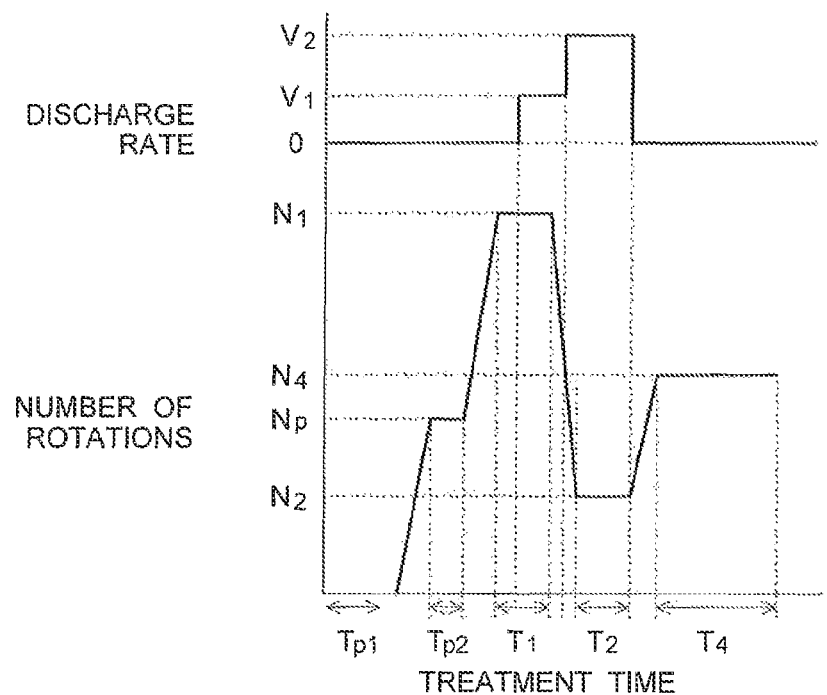

In FIG. 10, discharge of the coating liquid 3 at the first discharge rate "$V_1$" is started while the substrate 1 is rotated at the first number of rotations "$N_1$". Timing to start rotation and timing to start discharge may be out of alignment to some extent depending on types of the spin coating apparatus and conditions of programming. Even in such a case, setting the discharge rate according to the number of rotations makes it possible to form the coating film 4 having excellent surface uniformity in thickness while reducing the drop amount of the coating liquid 3.

Figure 11:
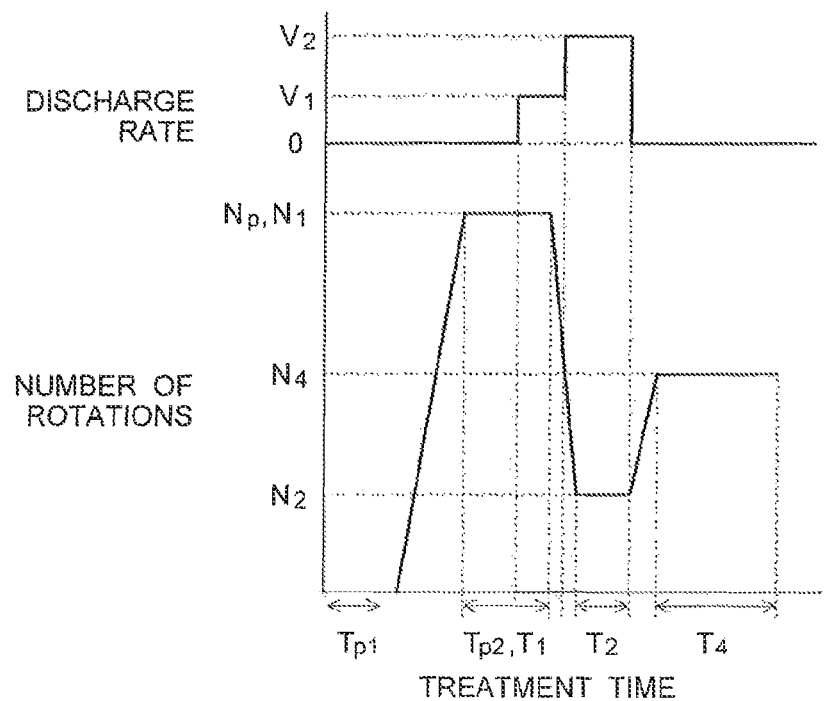

As shown in FIG. 11, it is also possible to set the same value for the number of rotations "$N_p$" and the first number of rotations "$N_1$", to continuously rotate the substrate 1 during these periods, and to start discharge of the coating liquid 3 at the first discharge rate "$V_1$" while the substrate 1 is rotated at the number of rotations "$N_p$" (="$N_1$").

Figure 12:
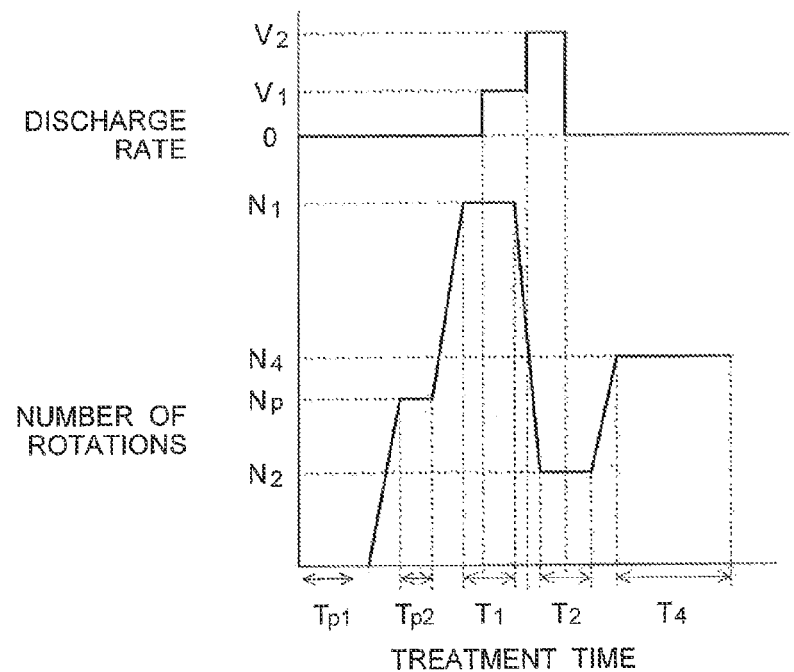

It is also possible, as shown in FIG. 12, to start discharge at the first discharge rate "$V_1$" while the substrate 1 is rotated at the first number of rotations "$N_1$" and to end the discharge at the second discharge rate "$V_2$" while the substrate 1 is rotated at the second number of rotations "$N_2$".

Figure 13:
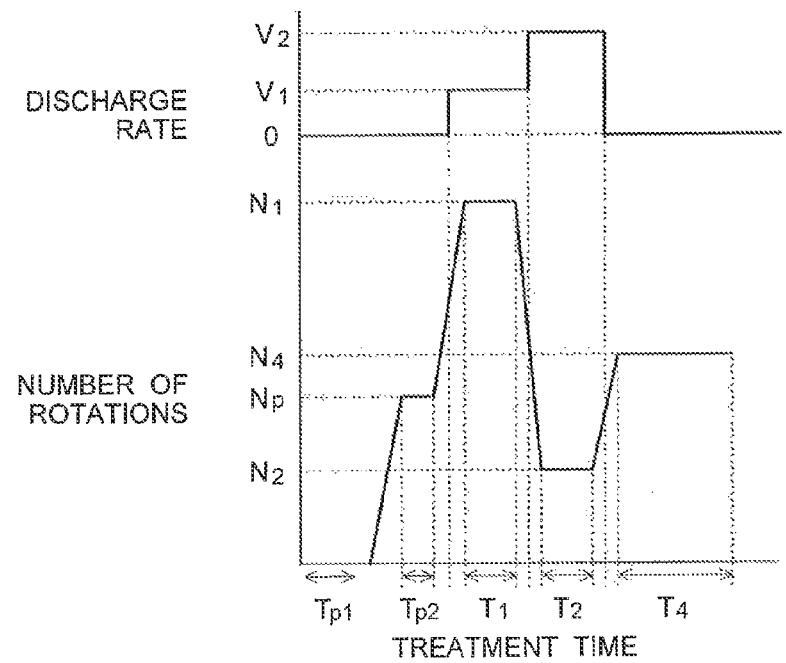

It is also possible, as shown in FIG. 13, to start discharge at the first discharge rate "$V_1$" before rotation of the substrate 1 at the first number of rotations "$N_1$" is started and to end the discharge at the second discharge rate "$V_2$" after rotation of the substrate 1 at the second number of rotations "$N_2$" is ended.

In the present embodiment as described in the foregoing, the timing to rotate the substrate 1 and the timing to discharge the coating liquid 3 may be out of alignment from each other. In the present embodiment, it may also be possible to use the examples of FIGS. 10 to 13 in combination.

Figure 14:
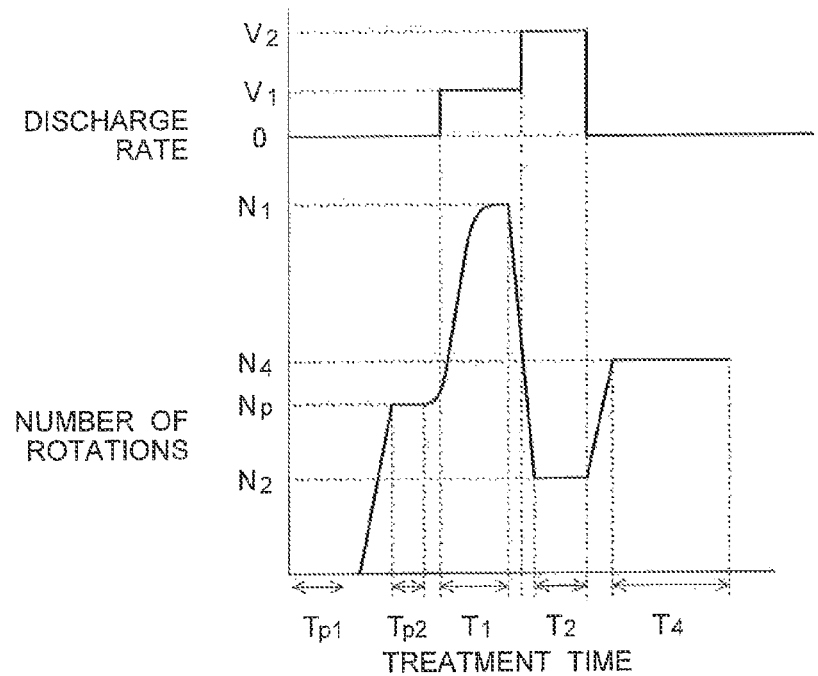
Figure 15:
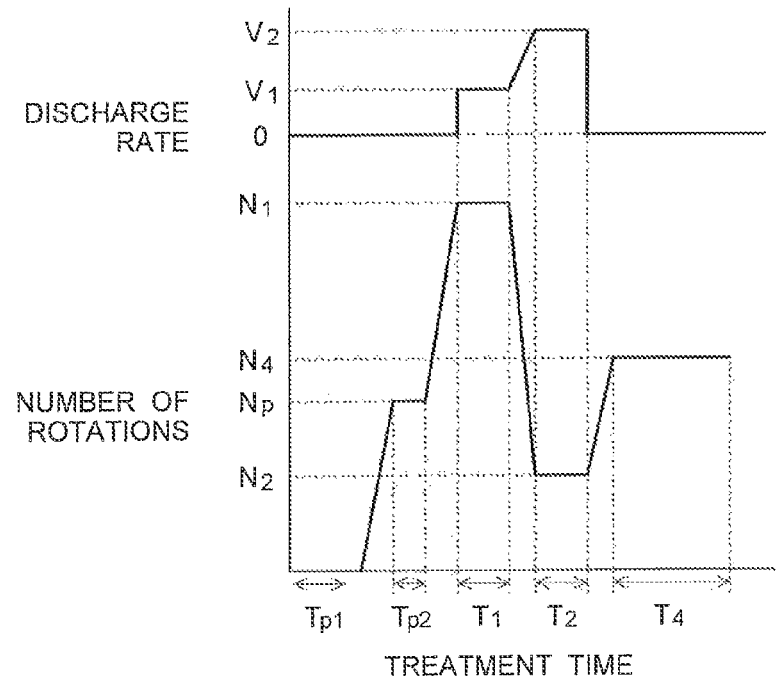
Figure 16:
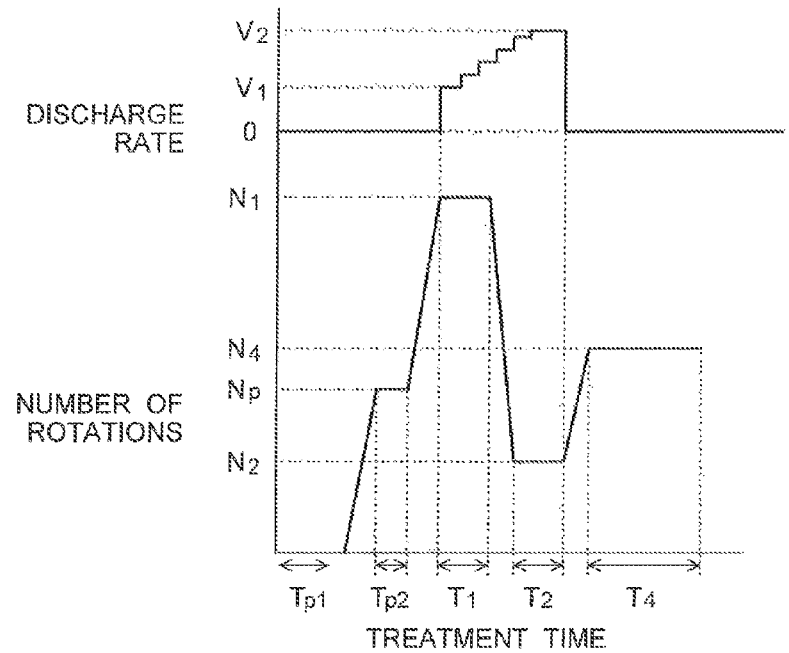

A description is now given of the spin coating methods of FIGS. 14 to 16.

In the present embodiment, it is not necessary to perform discharge of the coating liquid 3 when the number of rotations of the substrate 1 is fixed. For example, discharge at the first discharge rate "$V_1$" may be performed while the number of rotations of the substrate 1 is being increased as shown in FIG. 14. Contrary to the example of FIG. 14, the discharge at the first discharge rate "$V_1$" may be performed while the number of rotations of the substrate 1 is being lowered. This also applies to the discharge at the second discharge rate "$V_2$".

Change from the first discharge rate "$V_1$" to the second discharge rate "$V_2$" may gradually be performed as shown in FIG. 15, or may be performed in stages as shown in FIG. 16.

Figure 17:
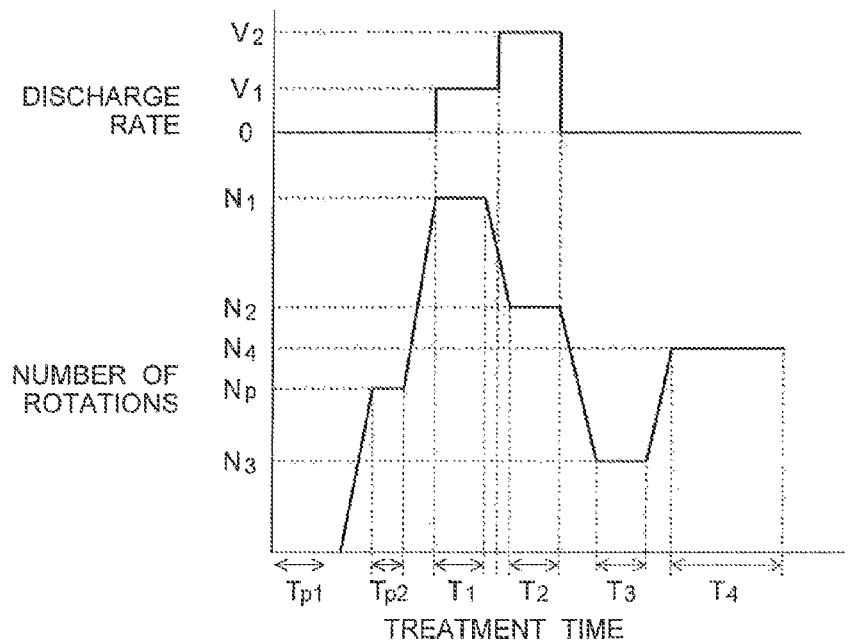
Figure 18:
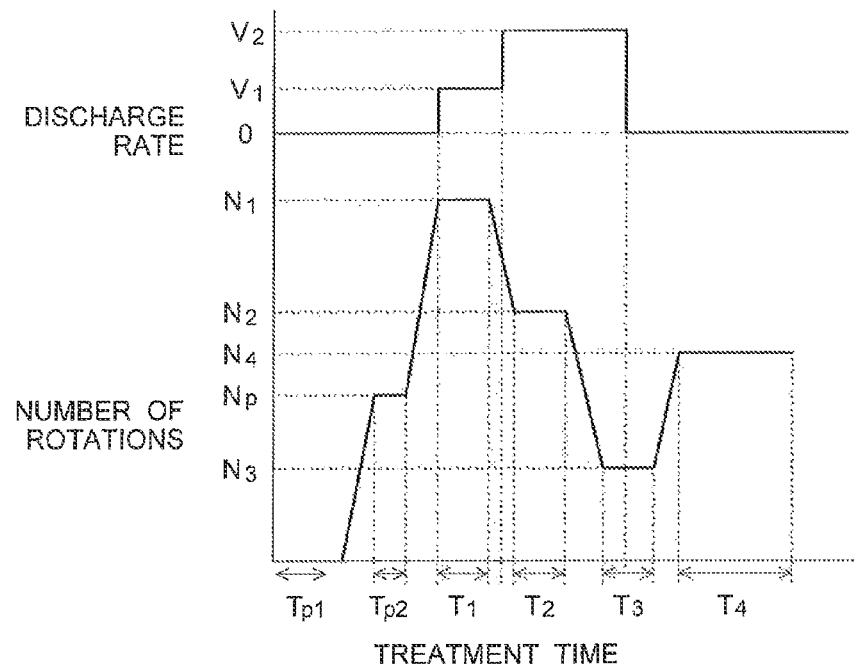
Figure 19:
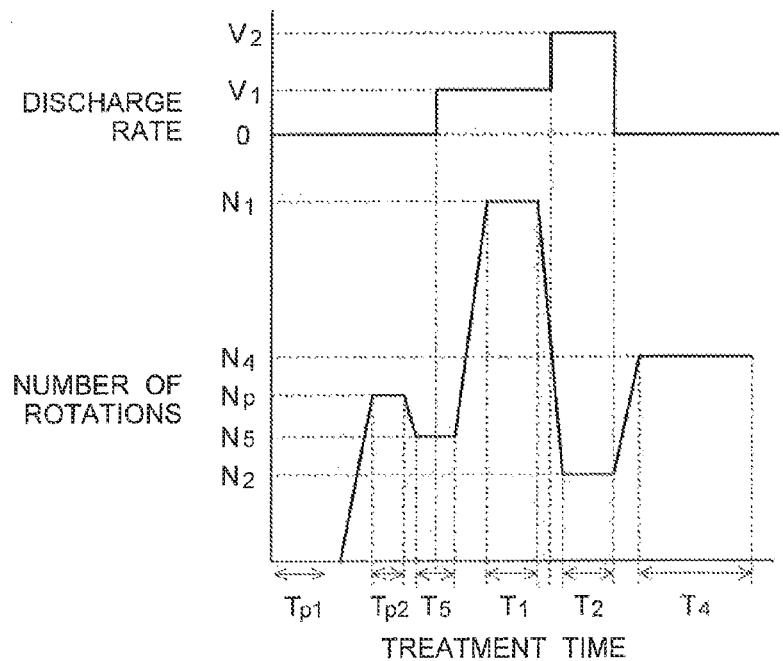

A description is now given of spin coating methods of FIGS. 17 to 19.

In FIGS. 17 and 18, the substrate 1 is rotated at the second number of rotations "$N_2$" and then is rotated at the number of rotations "$N_3$". The number of rotations "$N_3$" may be smaller or larger than the second number of rotations "$N_2$". The rotating treatment with the number of rotations "$N_3$" may be performed as a reflow step. In FIGS. 17 and 18, the substrate 1 is rotated at the number of rotations "$N_3$", and then is rotated at the number of rotations "$N_4$" which is to determine the thickness. The discharge of the coating liquid 3 at the second discharge rate "$V_2$" may be ended during rotation at the second number of rotations "$N_2$" as shown in FIG. 17, or may be continued until during rotation at the number of rotations "$N_3$" as shown in FIG. 18.

On the contrary, in FIG. 19, before being rotated at the first number of rotations "$N_1$", the substrate 1 is rotated at number of rotations "$N_5$" for time "$T_5$". The discharge at the first discharge rate "$V_1$" is started during rotation of the substrate 1 at the number of rotations "$N_5$" and is continued after the number of rotations of the substrate 1 is changed to the first number of rotations "$N_1$". In FIG. 19, the discharge at the first discharge rate "$V_1$" may be started after the end of the rotation at the number of rotations "$N_5$".

Figure 20:
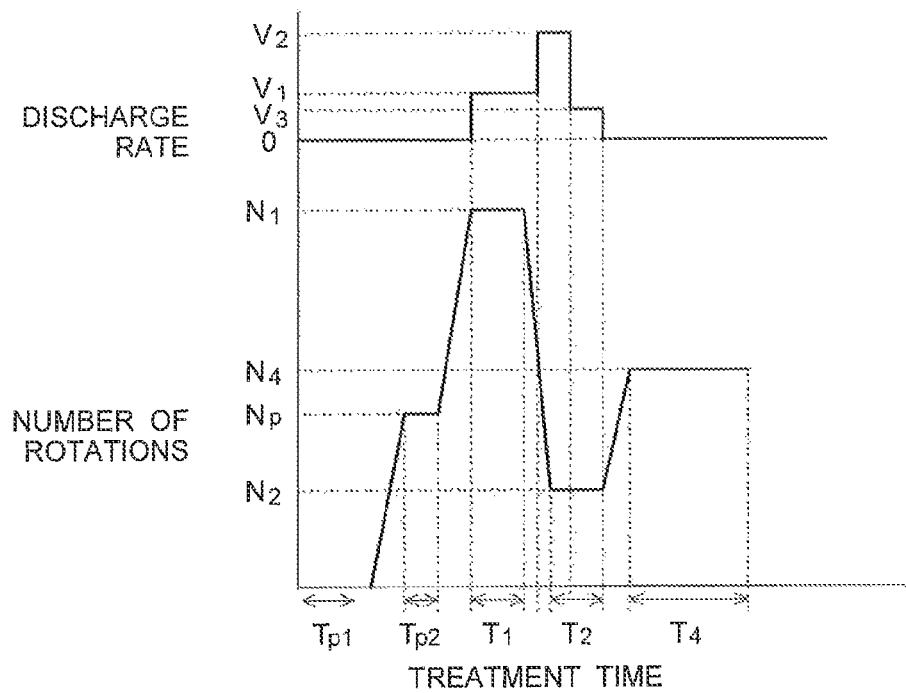
Figure 21:
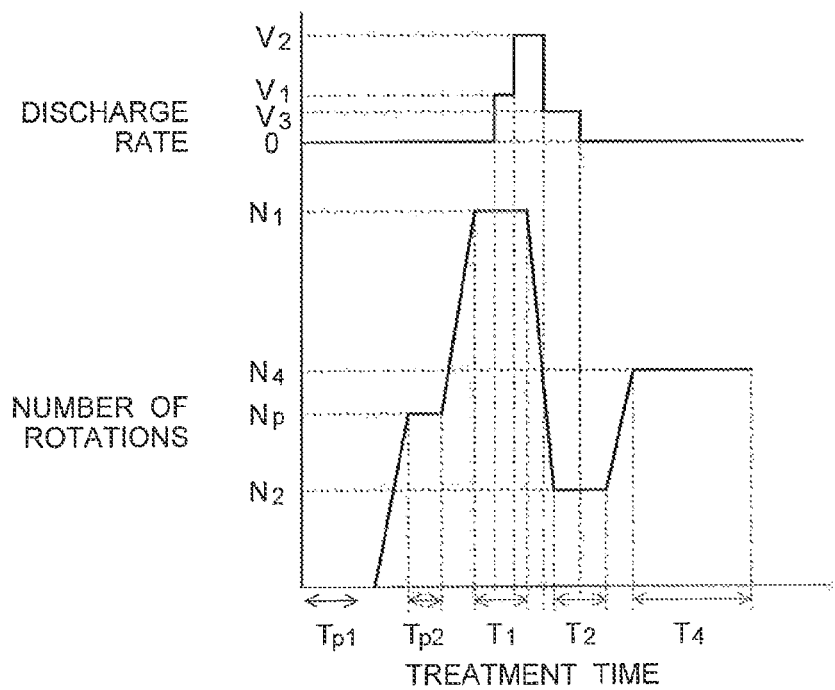

A description is now given of spin coating methods of FIGS. 20 and 21.

In FIG. 20, the coating liquid 3 is discharged at the second discharge rate "$V_2$" while the substrate 1 is rotated at the second number of rotations "$N_2$", and then the coating liquid 3 is discharged at the third discharge rate "$V_3$" while the number of rotations of the substrate 1 is maintained at the second number of rotations "$N_2$". In FIG. 20, the third discharge rate "$V_3$" is set smaller than the second discharge rate "$V_2$". The third discharge rate "$V_3$" may be larger or smaller than the first discharge rate "$V_1$", or may be identical to the first discharge rate "$V_1$".

A description is now given of the effects of the treatment of FIG. 20. In the treatments of FIGS. 6 to 19, the discharge rate of the coating liquid 3 is changed from the first discharge rate "$V_1$" to the second discharge rate "$V_2$". However, when the discharge rate is changed during the treatment in this way, the pressure in a coating liquid pipe is changed, which may put the coating liquid 3 in an unstable discharge state. For example, when the start and end of discharge is controlled by opening and closing of a valve, the coating liquid 3 may unintentionally be discharged or sucked due to pressure change in the pipe or volume change in the pipe caused by opening and closing the valve. If such a phenomenon is generated, air bubbles may be sucked into the pipe of the coating liquid 3 from the nozzle 12c and be accumulated in some cases, which causes unstable discharge of the coating liquid 3 and may thereby result in the uneven coating. Accordingly, in the treatment of FIG. 20, in order to prevent such sucking of the air bubbles, a small amount of the coating liquid 3 is additionally discharged for a short time in a state that the discharge rate is lowered to the third discharge rate "$V_3$" after the end of the discharge at the second discharge rate "$V_2$".

The drop amount of the coating liquid 3 at the third discharge rate "$V_3$" is preferably as small as possible. The drop amount is set to, for example, 0.01 to 0.02 ml. In this case, if the third discharge rate "$V_3$" is set to 1 ml/s, the drop time of the coating liquid 3 at the third discharge rate "$V_3$" becomes as short as 0.01 to 0.02 sec.

FIG. 21 shows a modified example of FIG. 20. In FIG. 21, the coating liquid 3 is discharged at the first discharge rate "$V_1$" while the substrate 1 is rotated at the first number of rotations "$N_1$". Next, while the number of rotations of the substrate 1 is maintained at the first number of rotations "$N_1$", the coating liquid 3 is discharged at the second discharge rate "$V_2$". Next, the number of rotations of the substrate 1 is reduced to the second number of rotations "$N_2$", and during the reduction in the number of rotations, the discharge rate of the coating liquid 3 is lowered to the third discharge rate "$V_3$". Then, the discharge at the third discharge rate "$V_3$" is ended while the substrate 1 is rotated at the second number of rotations "$N_2$". According to the treatment of FIG. 21, the discharging state of the coating liquid 3 may be improved as similarly to the case of the treatment of FIG. 20.

The discharge at the third discharge rate "$V_3$" in FIGS. 20 and 21 may be performed immediately after any one of the discharge operations at the second discharge rate "$V_2$" shown in FIGS. 5 to 19. In other words, the treatment of FIG. 20 or 21 may be performed in combination with the treatments of FIGS. 5 to 19.

A technique for discharging a small amount of the coating liquid 3 at a low discharge rate at the end of discharge operation so as to improve the discharge state as in the treatments of FIGS. 20 and 21 may be used not only in the spin coating method but also in other coating methods. This technique may also be applied to the case where the pre-wet liquid 2 is not used. Although the amount of the coating liquid 3 to be used is increased in the case where the pre-wet liquid 2 is not used as compared with the case where the pre-wet liquid 2 is used, the coating film 4 having sufficient surface uniformity in thickness may be formed with the discharge rate control effect according to the second embodiment.

In the treatments of FIGS. 20 and 21, the discharge for improvement of the discharging state is performed after the coating liquid 3 is discharged at two stage discharge rates "$V_1$" and "$V_2$". Instead of this, the discharge for improvement of the discharging state may be performed after the coating liquid 3 is discharged at the discharge rate of three or more stages. In other words, prior to the discharge for improvement of the discharging state, the discharge rate may be changed as many number of times as desired.

Further, a step of changing the rotation speed of the substrate 1 may be added before/after or during discharge of the coating liquid 3 at the discharge rate "$V_3$".

The treatments of FIGS. 6 to 21 are merely examples of the spin coating method of the second embodiment. The spin coating method of the second embodiment may be executed by combining the treatments of FIGS. 6 to 21 and also be executed in a form different from the treatments of FIGS. 6 to 21.

In order to perform the coating treatment while changing the number of rotations of the substrate 1 and the discharge rate of the coating liquid 3 as the second embodiment, it is desired to perform precise control on the number of rotations and precise discharge control. For example, when a photoresist is used as the coating liquid 3, it is sometimes required to set the drop amount to 0.5 ml or less under the present circumstances. Accordingly, it is desired to achieve precise control which allows the coating treatment of the second embodiment to be executed even under such circumstances.

For example, in the coating treatment of FIG. 6, it is assumed that the first discharge amount "$M_1$" is set to 0.4 ml and the second discharge amount "$M_2$" is set to 0.1 ml ("$M_1$+$M_2$"=0.5 ml). In this case, if the first discharge rate "$V_1$" is 0.5 ml/s, the time "$T_1$" is 0.8 sec. If the second discharge rate "$V_2$" is 1 ml/s, the time "$T_2$" is 0.1 sec. In this case, if the second discharge rate "$V_2$" is increased to 2 ml/s, the time "$T_2$" is reduced to 0.05 sec. In this way, increasing the second discharge rate "$V_2$" necessitates reduction in the time "$T_2$", and results in a need for more precise control. Measures against this problem will be described later.

2) Specific Examples of Spin Coating Method of Second Embodiment

FIG. 22 is a table for explaining a specific example of the spin coating method of the second embodiment. FIG. 22 shows an example of the recipe for the spin coating method of the second embodiment. Hereinafter, a description will be given of the case where the above spin coating apparatus is operated based on this recipe. Experiments regarding this recipe are conducted by using the coating liquid 3 with a viscosity of 1 mPa·s.

First, the pre-wet liquid feeding module 11 drops a drop amount "$M_p$" of the pre-wet liquid 2 to the central portion of the wafer 1 (Step S1). The drop amount "$M_p$" is 3 ml, for example.

Next, the motor 15 rotates the wafer 1 at the number of rotations "$N_p$", so that the pre-wet liquid is spread on the surface of the wafer 1 (Step S2). For example, the number of rotations "$N_p$" is 1000 to 4000 rpm. For example, the rotating time "$T_{p2}$" is 0.1 to 3 sec (preferably 0.5 sec or more).

Next, the coating liquid feeding module 12 drops a first drop amount "$M_1$" of the coating liquid 3 to the central portion of the wafer 1 while the motor 15 rotates the wafer 1 at the first number of rotations "$N_1$", so that the coating liquid 3 is spread on the surface of the wafer 1 (Step S3).

Here, the first number of rotations "$N_1$" may be set to the number of rotations at which the first drop amount "$M_1$" of the coating liquid 3 does not uniformly spread on the entire wafer 1 due to air resistance. For example, when the wafer 1 has a diameter of 300 mm, the first number of rotations "$N_1$" is set to 2500 to 4000 rpm. Since the pre-wet liquid 2 dropped prior to the coating liquid 3 has a low viscosity, it is not susceptible to air resistance. Accordingly, even when the coating liquid 3 stops flowing on the substrate 1 due to air resistance, the pre-wet liquid 2 can flow on the substrate 1 and reach the peripheral portion of the substrate 1. The first number of rotations "$N_1$" may be set lower than 2500 rpm so as to reduce the air resistance received by the coating liquid 3.

The first drop amount "$M_1$" is about 0.3 ml, for example. In Step S3, the coating liquid 3 is discharged at the first discharge rate "$V_1$", and the first discharge rate "$V_1$" is set to 0.2 to 0.8 ml/s. As a result, discharge time at the first discharge rate "$V_1$" is 0.375 to 1.5 sec. In this case, although the rotating time "$T_1$" is set according to the discharge time, it is not necessary to completely coincide the rotating time "$T_1$" with the discharge time. It is not necessary to coincide the timing to start or end discharge with the timing to start or end rotation.

Next, the coating liquid feeding module 12 drops a second drop amount "$M_2$" of the coating liquid 3 to the central portion of the wafer 1 while the motor 15 rotates the wafer 1 at the second number of rotations "$N_2$" which is smaller than the first number of rotations "$N_1$", so that the coating liquid 3 is further spread on the surface of the wafer 1 (Step S4).

Dropping the first drop amount "$M_1$" of the coating liquid 3 and dropping the second drop amount "$M_2$" of the coating liquid 3 may be continuously performed. The second drop amount "$M_2$", which may be smaller than the first drop amount "$M_1$", is set to, for example, about 0.1 ml. In this case, a total drop amount "$M_1$"+"$M_2$" of the coating liquid 3 is about 0.4 ml. The second number of rotations "$N_2$" is set to, for example, 2000 to 3000 rpm, which is smaller than the first number of rotations "$N_1$".

In Step S4, the coating liquid 3 is discharged at the second discharge rate "$V_2$", while the second discharge rate "$V_2$" is set to 1.0 to 2.5 ml/s. As a result, discharge time at the second discharge rate "$V_2$" is 0.04 to 0.1 sec. In this case, although the rotating time "$T_2$" is set according to the discharge time, it is not necessary to completely coincide the rotating time "$T_2$" with the discharge time. It is not necessary to coincide the timing to start or end discharge with the timing to start or end rotation.

Next, the motor 15 rotates the wafer 1 at number of rotations "$N_4$" for determining the film thickness (Step S5). As a consequence, the thickness of the coating film 3 coating the wafer 1 is controlled to be a desired value. For example, the number of rotations "$N_4$" is 1900 rpm, and the rotating time "$T_4$" is 15 sec.

In this recipe, thinner is then used to cut the edge of the coating liquid 3 and to clean the back surface. Furthermore, the wafer 1 is automatically transferred to a hot plate, where the wafer 1 is baked to evaporate a solvent of the coating liquid 3. The baked wafer 1 is then cooled. In this way, the coating film 4 is formed from the coating liquid 3.

The coating liquid 3 applied based on this recipe was observed and its thickness was measured. As a result, uneven coating was not observed and the surface uniformity in thickness was found to be sufficient.

FIG. 23 is a table for explaining another specific example of the spin coating method of the second embodiment. Similarly to FIG. 22, FIG. 23 shows an example of the recipe for the spin coating method of the second embodiment.

First, a drop amount "$M_p$" of the pre-wet liquid 2 is dropped onto the wafer 1 (Step S1). For example, the drop amount "$M_p$" is 3 ml. Next, the wafer 1 is rotated at number of rotations "$N_p$", so that the pre-wet liquid is spread on the surface of the wafer 1 (Step S2). For example, the number of rotations "$N_p$" is 1000 to 4000 rpm, and the rotating time "$T_{p2}$" is 0.1 to 3 sec.

Next, a first drop amount "$M_1$" of the coating liquid 3 is dropped to the wafer 1 while the wafer 1 is rotated at the first number of rotations "$N_1$", so that the coating liquid 3 is spread on the surface of the wafer 1 (Step S3). For example, the first number of rotations "$N_1$" is 2500 to 4000 rpm, and the first drop amount "$M_1$" is about 0.3 ml. In Step S3, the coating liquid 3 is discharged at the first discharge rate "$V_1$", while the first discharge rate "$V_1$" is set to 0.2 to 0.8 ml/s.

Next, the second drop amount "$M_2$" of the coating liquid 3 is dropped onto the wafer 1 while the wafer 1 is rotated at the second number of rotations "$N_2$", which is smaller than the first number of rotations "$N_1$", so that the coating liquid 3 is further spread on the surface of the wafer 1 (Step S4). For example, the second number of rotations "$N_2$" is 2000 to 3000 rpm, and the second drop amount "$M_2$" is about 0.1 ml. In Step S4, the coating liquid 3 is discharged at the second discharge rate "$V_2$", while the second discharge rate "$V_2$" is set to 1.0 to 2.5 ml/s.

Next, the wafer 1 is rotated at number of rotations "$N_3$" to perform reflow treatment (Step S5). The reflow treatment improves uniformity in thickness of the coating liquid 3 which is applied on the wafer 1. For example, the number of rotations "$N_3$" is 100 rpm, and the rotating time "$T_3$" is 1 sec.

Next, the wafer 1 is rotated at number of rotations "$N_4$" for determining the film thickness (Step S6). As a consequence, the thickness of the coating film 3 coating the wafer 1 is controlled to be a desired value. For example, the number of rotations "$N_4$" is 1900 rpm, and the rotating time "$T_4$" is 15 sec.

In this recipe, the edge cut of the coating liquid 3, the cleaning of the back surface, the baking of the wafer 1, and the cooling of the wafer 1 are performed. In this way, the coating film 4 is formed from the coating liquid 3.

The coating liquid 3 applied based on this recipe was observed and its thickness was measured. As a result, uneven coating was not observed and the surface uniformity in thickness was found to be sufficient.

FIG. 24 is a table showing results of experiments by the spin coating method of the second embodiment. More specifically, FIG. 24 shows results of observing the uneven coating and results of measuring the thickness uniformity when a variety of coating amounts "$M_1+M_2$" of the coating film 3 were applied based on the recipe of FIG. 22.

According to the results shown in FIG. 24, while the thickness uniformity was sufficient even in the case of "$M_1+M_2$"=0.30 ml, the uneven coating occurred with "$M_1+M_2$"=0.30 ml. This result indicates that setting the coating amount "$M_1+M_2$" to 0.32 ml or more makes it possible to provide the coating film 3 having sufficient thickness uniformity while suppressing occurrence of the uneven coating.

On the other hand, the coating film 3 was applied without the use of the pre-wet liquid 2 and with the setting of "$M_1 \times M_2$"=0.40 ml based on the recipes of FIGS. 22 and 23 or based on other methods of the second embodiment. As a result, no matter which method was adopted, the uneven coating occurred and areas not coated with the coating film 3 remained in the peripheral portion of the wafer 1.

A description is now given of the results of experiments in which the discharge at the third discharge rate "$V_3$" for improvement of the discharging state was applied to the recipe of FIG. 22.

After the discharge at the second discharge rate "$V_2$" was performed based on the recipe of FIG. 22, the state of the coating liquid nozzle 12c was observed. As a result, a phenomenon was observed that as a difference between the first discharge rate "$V_1$" and the second discharge rate "$V_2$" became larger, air was sucked into the nozzle 12c while the coating liquid 3 flowed backward as soon as the discharge was ended. When this phenomenon becomes notable, air bubbles are taken into the pipe and problems such as coating failure arise.

Accordingly, after the coating liquid 3 was discharged at the first and second discharge rates "$V_1$" and "$V_2$" based on the recipe of FIG. 22, a discharge amount "$M_3$" of the coating liquid 3 was discharged at the third discharge rate "$V_3$". A value of "$V_3$" was set to "$V_1$" or more and less than "$V_2$". For example, when the rate "$V_3$" was set to 0.25 to 1.0 ml/s and the amount "$M_3$" was set to 0.01 to 0.02 ml, the discharging state of the nozzle 12c was improved.

It is considered that the amount as small as 0.1 ml or less (e.g., 0.01 to 0.20 ml) is sufficient as the discharge amount of the coating liquid 3 at the third discharge rate "$V_3$", and the discharge time is often set to 0.1 sec or less (e.g., 0.01 to 0.02 sec). Accordingly, the coating liquid feeding module 12 of the present embodiment is desirably configured so that the discharge amount of the coating liquid 3 can be controlled in units of 0.1 ml or less (e.g., in units of 0.01 ml and units of less than 0.01 ml), and the discharge time of the coating liquid 3 can be controlled in units of 0.1 sec or less (e.g., in units of 0.01 sec and units of less than 0.01 sec). Such configuration can be implemented by, for example, reducing the diameter of the nozzle 12c, or by enhancing the performance of the discharge controller 12e. Similarly, the time of rotating the motor 15 is desirably configured so as to be controlled in units of 0.1 sec or less (e.g., in units of 0.01 sec and units of less than 0.01 sec).

According to such configuration of the present embodiment, the first to third discharge times during which the coating liquid 3 is discharged respectively at the first to third discharge rates "$V_1$" to "$V_3$" can be set to 0.1 sec or less, and the first to third discharge amounts of the coating liquid 3 which are respectively discharged at the first to third discharge rates "$V_1$" to "$V_3$" can be set to 0.1 ml or less. In the present embodiment, only one of the first to third discharge times may be set to 0.1 sec or less, or two or more of them may be set to 0.1 sec or less. Similarly, in the present embodiment, only one of the first to third discharge amounts may be set to 0.1 ml or less, or two or more of them may be set to 0.1 ml or less.

The coating liquid feeding module 12 and the motor 15 configured in this way not only enhance precision in discharge at the third discharge rate "$V_3$", but also enhance precision in change between the first and second discharge rates "$V_1$" and "$V_2$".

As described above, in the present embodiment, when the coating liquid 3 is dropped while the substrate 1 is rotated at the first number of rotations "$N_1$", the coating liquid 3 is discharged to the substrate 1 at the first discharge rate "$V_1$". Moreover, in the present embodiment, when the coating liquid 3 is dropped while the substrate 1 is rotated at the second number of rotations "$N_2$" which is smaller than the number of rotations "$N_1$", the coating liquid 3 is discharged to the substrate 1 at the second discharge rate "$V_2$" which is larger than the first discharge rate "$V_1$". Therefore, according to the present embodiment, it is possible to form the coating film 4 in a wider area while reducing the drop amount of the coating liquid 3. Furthermore, according to the present embodiment, it is possible to improve in-plane uniformity in thickness of the coating liquid 3 more than that in the case of the first embodiment.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

For example, according to these embodiments, even when the pre-wet treatment is not performed, the amount of the coating liquid 3 to be used can be reduced by changing the discharge rate. Moreover, in these embodiments, when the pre-wet treatment is not performed, the swell of the coating liquid 3 may not be formed at the end portion of the coating liquid 3, and the coating liquid 3 may be caused to reach the end portion of the substrate 1 by the discharge of the first drop amount "$M_1$".

The invention claimed is:

1. A spin coating method comprising:
   dropping a first drop amount of coating liquid onto a portion of a substrate at a first discharge rate while rotating the substrate at a first number of revolutions per minute; and
   dropping a second drop amount of the coating liquid onto the portion of the substrate at a second discharge rate which is larger than the first discharge rate while rotating the substrate at a second number of revolutions per minute which is smaller than the first number of revolutions per minute after the first drop amount of the coating liquid is dropped,
   wherein the coating liquid is discharged onto the substrate at a third discharge rate which is smaller than the second discharge rate, after the coating liquid is discharged onto the substrate at the second discharge rate.

2. The method of claim 1, wherein
   when the coating liquid is dropped while the substrate is rotated at the second number of revolutions per minute, the coating liquid is discharged onto the substrate at the second discharge rate and then discharged onto the substrate at the third discharge rate.

3. The method of claim 1, further comprising
   dropping a pre-wet liquid which has a vapor pressure of 6 hPa or less at 23° C. onto the substrate and rotating the substrate, before the coating liquid is dropped onto the substrate.

4. The method of claim 3, wherein
   the pre-wet liquid has a vapor pressure lower than a vapor pressure of di-n-butyl ether.

5. The method of claim 1, wherein
   the coating liquid contains silazanes or siloxanes.

6. The method of claim 3, wherein
   time from a start of rotating the substrate to spread the pre-wet liquid on the surface of the substrate to a start of dropping of the coating liquid is 1 second or more.

7. The method of claim 3, wherein
   time from a start of rotating the substrate to spread the pre-wet liquid on the surface of the substrate to an end of dropping of the coating liquid is 1.5 seconds or more.

8. The method of claim 1, wherein the second drop amount of the coating liquid is dropped such that the second drop amount is set less than the first drop amount and the coating liquid spreads to an edge portion of the substrate or to a vicinity of the edge portion of the substrate.

* * * * *